United States Patent [19]
O'Neill

[11] Patent Number: 6,111,190
[45] Date of Patent: Aug. 29, 2000

[54] INFLATABLE FRESNEL LENS SOLAR CONCENTRATOR FOR SPACE POWER

[75] Inventor: Mark Joseph O'Neill, Keller, Tex.

[73] Assignee: Entech, Inc., Keller, Tex.

[21] Appl. No.: 09/040,733

[22] Filed: Mar. 18, 1998

[51] Int. Cl.$^7$ ............ H01L 31/052; H01L 31/045; F24J 2/36

[52] U.S. Cl. ............ 136/246; 136/259; 136/245; 126/624; 126/625; 126/680; 126/698; 126/700; 126/697; 126/909; 250/216; 359/742; 359/743; 165/46; 52/2.19

[58] Field of Search .................... 136/246, 259, 136/245; 126/624, 625, 680, 698, 700, 697, 909; 250/216; 359/742, 743; 165/46; 52/2.19

[56] References Cited

U.S. PATENT DOCUMENTS

| | | | |
|---|---|---|---|
| 3,125,091 | 3/1964 | Sleeper | 126/624 |
| 4,069,812 | 1/1978 | O'Neill | 136/246 |
| 5,344,497 | 9/1994 | Fraas et al. | 136/246 |
| 5,498,297 | 3/1996 | O'Neill et al. | 136/246 |
| 5,505,789 | 4/1996 | Fraas et al. | 136/246 |
| 5,660,644 | 8/1997 | Clemens | 136/245 |

OTHER PUBLICATIONS

O'Neill, Chapter 10 of the textbook, Solar Cells and their Applications, published by John Wiley in 1995 (Month Unknown).

O'Neill and Piszczor, "Inflatable Lenses for Space Photovoltaic Concentrator Arrays," 26th IEEE Photovoltaic Specialists Conference, Anaheim, Oct. 1997.

O'Neill and Piszczor, "Ultralight Inflatable Fresnel Lens Solar Concentrator's," 1st Conference on Orbital Transfer Vehicles at the Space Technology & Applications International Forum (STAIF–98), Albuquerque, Jan. 1998.

Copy of the Jet Propulsion Laboratories World Wide Web Page on the Inflatable Antenna Experiment of May 20, 1996 (URL: http//www.jpl.nasa.gov/iae).

*Primary Examiner*—Alan Diamond
*Attorney, Agent, or Firm*—Sankey & Luck, L.L.P.

[57] ABSTRACT

A novel, high-efficiency, extremely light-weight, inflatable refractive solar concentrator for space power is described. It consists of a flexible Fresnel lens, flexible sides, and a back surface, together enclosing a volume of space which can be filled with low pressure gas to deploy the concentrator on orbit. The back surface supports the energy receiver/converter located in the focal region of the Fresnel lens. The back surface can also serve as the waste heat radiator. Prior to deployment, the deflated flexible lens and sides are folded against the back surface to form a flat, low-volume package for efficient launch into space. The inflatable concentrator can be configured to provide either a line focus or a point focus of sunlight. The new inflatable concentrator approach will provide significant advantages over the prior art in two different space power areas: photovoltaic concentrator arrays and high-temperature solar thermal conversion systems. Photovoltaic concentrator arrays using the new inflatable lens will be much lighter than prior space concentrator arrays. In addition, for photovoltaic concentrator arrays, the new inflatable lens will eliminate the need for a fragile glass superstrate to support the lens, substantially improving robustness of the lens. Solar thermal concentrator arrays using the new inflatable lens will be much lighter than prior art space concentrators which used parabolic mirrors. In addition, for solar thermal applications in space, the new inflatable lens will eliminate the need for high surface accuracy, which has been a significant problem for prior art concentrators.

20 Claims, 3 Drawing Sheets

INFLATABLE FRESNEL LENS SOLAR CONCENTRATOR FOR SPACE POWER

BACKGROUND

1. Field of Invention

The present invention relates generally to solar power systems for space satellite applications. More specifically, this invention relates to solar concentrators for space power, particularly lightweight inflatable solar concentrators for photovoltaic and/or solar thermal energy conversion systems.

2. Description of Prior Art

Prior art solar electric power supplies for space satellites use large flat plate arrays of solar cells made from silicon, gallium arsenide, or another semiconductor material. These prior art flat plate solar arrays are generally very expensive due to the large area of semiconductor material required. These prior art solar arrays are generally heavy due to the combined mass of solar cell, cover glass, and backup structure. These prior art arrays are generally bulky and fragile, complicating their packaging for launch into space. These prior art arrays are also complex to deploy on orbit, requiring mechanical means to unfold the arrays and properly position them for operation.

To minimize or overcome these problems, new approaches to solar electric power supplies for space satellites have recently been developed by Fraas and O'Neill, U.S. Pat. No. 5,344,497 and U.S. Pat. No. 5,505,789. The new approaches use Fresnel lenses to collect and focus sunlight onto very high efficiency tandem-junction solar cells. By using a relatively inexpensive Fresnel lens to collect the sunlight and to focus it onto much smaller solar cells, the cost and weight of the cells are dramatically reduced. By using very high efficiency cells, the required array area is minimized, reducing overall system weight and launch volume. The advantages of the new Fresnel lens concentrating solar electric power supply are now being widely recognized, as witnessed by the selection of this approach for the NASA Jet Propulsion Laboratory's New Millennium Deep Space One satellite scheduled for launch in July 1998. The Fresnel lens concentrating solar array on Deep Space One will provide not only the power for the satellite, but also the power for the electric propulsion system which will propel the probe to encounters with an asteroid, the planet Mars, and a comet.

Despite the many advantages of the Fresnel lens concentrating solar array previously invented by O'Neill and Fraas, this array still has shortcomings in need of improvement. Specifically, the Fresnel lens is presently made from a space qualified, optically clear silicone rubber material (e.g., Dow Corning DC 93-500). This thin rubber lens (e.g., 250 microns thick) must be laminated to a thin (e.g., 80 microns thick) ceria-doped glass superstrate to maintain the required arch shape of the lens assembly. The glass is a structural component, not required for the optical functioning of the lens. Unfortunately, the glass increases the weight, cost, launch volume, and fragility of the lens. Until now, if the glass were not used, the lens would not maintain its shape, even in the zero-gravity environment of space. The presently used glass/silicone Fresnel lens also requires a supporting structure to properly position the lens above the solar cells. This lens support structure adds further weight, cost, and complexity to the solar power system.

To overcome these problems with the prior art Fresnel lens solar concentrator, I have invented an inflatable Fresnel lens which provides all of the benefits of solar concentration, while overcoming the cost, weight, launch volume, and fragility problems of the prior art approach.

Prior art solar thermal power supplies for space satellites use parabolic mirrors to focus sunlight onto solar thermal energy receivers. The high-temperature heat produced by the focussed sunlight can be used for solar thermal propulsion, or for solar dynamic energy conversion, using heat engines based on a Brayton cycle, Stirling cycle, Rankine cycle, or other thermodynamic cycle. These prior art solar thermal power supplies require extremely accurate parabolic mirror surfaces to achieve acceptably high concentration of the solar energy. Prior art solar concentrators for solar thermal power supplies are expensive and heavy, due to the high accuracy requirements of the mirrors.

To minimize or overcome these problems with prior art solar concentrators for solar thermal power in space, an Inflatable Antenna Experiment (IAE) was developed by NASA et al. and launched from the U.S. Space Shuttle in May 1996. This lightweight inflatable parabolic mirror demonstrated mirror surface accuracy that is adequate for radio frequency communication applications, but not adequate for solar concentrator applications. To overcome these problems with the prior art concentrators for solar thermal applications in space, I have invented a second embodiment of the inflatable Fresnel lens which provides all of the benefits of high concentration, while overcoming the cost, weight, and severe accuracy requirements of the prior art parabolic mirror approaches.

While other inventors have proposed approaches to inflatable concentrators for space power in the past, all of these approaches have had substantial shortcomings. For example, Clemens, U.S. Pat. No. 5,660,644, proposed an inflatable reflective concentrator for space power. However, all reflective concentrators require a much higher degree of surface accuracy than an optimized refractive concentrator, as discussed by O'Neill in Chapter 10 of the textbook, *Solar Cells and their Applications*, published by John Wiley in 1995. An optimized refractive concentrator corresponds to the Fresnel lens configuration taught by O'Neill in U.S. Pat. No. 4,069,812. Since reflective concentrators need more than 100 times better shape accuracy than an optimized refractive concentrator, the reflective devices will be more expensive, heavier, and lower performing, than optimized refractive concentrators.

Sleeper, U.S. Pat. No. 3,125,091, proposed an inflatable refractive concentrator for ground or space power applications. The Sleeper configuration relied on a full cylinder inflated structure for line-focus applications, and a full spherical inflated structure for point-focus applications. The full cylinder and full sphere approaches of Sleeper required the energy receiver/converter to be located either entirely inside or entirely outside of the inflatable concentrator, complicating the positioning and support of these key receiver/converter components. Furthermore, removing waste heat from the interior of Sleeper's concentrators was difficult, requiring bulky coolant fluid conduits to penetrate the ends or sides of the inflated concentrator.

In contrast to the Sleeper approach, my new invention integrates the receiver/converter with the back surface of the inflatable concentrator. The back surface of my invention is thereby able to provide simple positioning and support for the receiver/converter. Furthermore, unlike the Sleeper approach, the back surface of my invention can also serve as the waste heat radiator for the concentrator. Furthermore, unlike the Sleeper approach, the back surface of my invention can be flatter and stronger than the flexible cylindrical or spherical front and side surfaces of the concentrator. This flatter, stronger back surface can also provide a convenient, low-volume platform for stowing the flexible lens and sides of the deflated concentrator for launch into space. Still furthermore, my invention is compatible with the optimized refractive concentrator approach taught by O'Neill, U.S. Pat. No. 4,069,812. Since this optimized lens maximizes both optical efficiency and shape error tolerance, it is ideally suited for an inflatable concentrator application.

The dramatic extent of the improvement provided by my invention is described by O'Neill and Piszczor in "Inflatable Lenses for Space Photovoltaic Concentrator Arrays," in the Proceedings of the 26th IEEE Photovoltaic Specialists Conference, October 1997. While the present state of the art in space photovoltaic arrays is represented by a power-to-mass ratio, also called specific power, of about 50 Watts per kilogram, the new inflatable concentrator should extend this critical system performance index to 400 Watts per kilogram, an eight-fold gain. This extraordinary prediction is based on measured mass and performance values for functional prototypes of my invention. These prototypes provided a measured 92% net optical efficiency and weighed less than 0.8 kilograms per square meter of lens aperture area.

In summary, my inflatable Fresnel lens invention overcomes prior art problems in two related, but different, space power fields: solar electric arrays and solar thermal concentrators. The innovativeness and usefulness of my new invention have been recognized by NASA by the selection of this new inflatable solar concentrator technology for development under the NASA Small Business Innovation Research (SBIR) program, specifically under Contract No. NAS397073.

OBJECTS AND ADVANTAGES

Accordingly, several objects and advantages of my invention are to provide improved solar concentrators for space power applications, said improved concentrators providing lower mass, lower launch volume, lower cost, easier deployment on orbit, enhanced tolerance of the space environment, and higher optical performance than prior art concentrators. Other objects and advantages of my invention include improved solar concentrators for space photovoltaic power systems, said improved concentrators providing higher specific power in terms of system mass per unit power produced.

Other objects and advantages of my invention include improved solar concentrators for space solar thermal propulsion systems, said improved concentrators providing higher solar flux concentration for improved high temperature heat collection. Still further objects and advantages of my invention include improved solar concentrators for space solar dynamic power systems, including Brayton, Stirling, and Rankine cycle systems.

Still further objects and advantages will become apparent from a consideration of the ensuing description and accompanying drawings.

Figure 1:
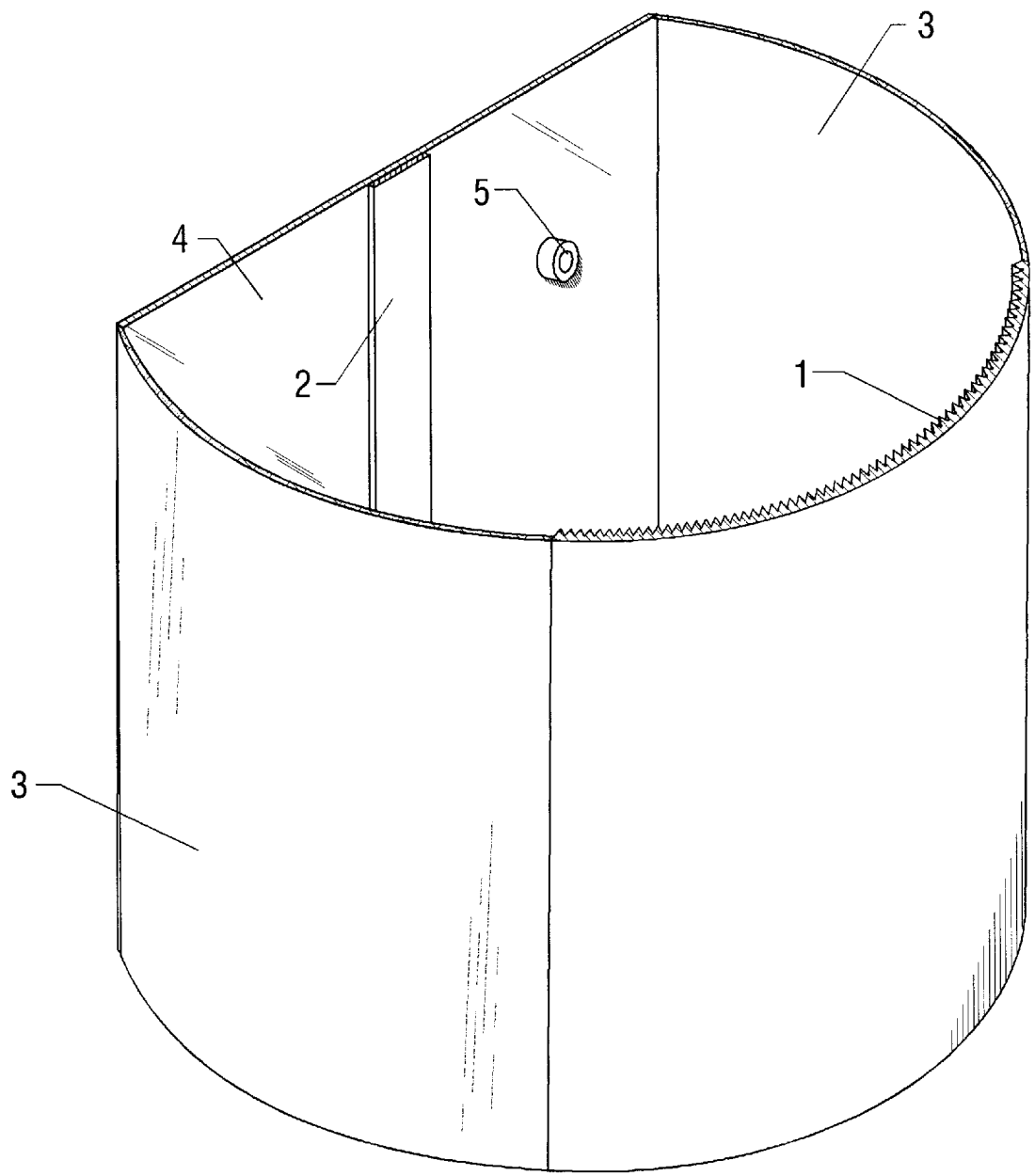
FIG. 1 is a perspective view of a line-focus embodiment of my invention, with an end cap removed to show the inner components.

REFERENCE NUMERALS IN DRAWINGS 1 flexible line-focus Fresnel lens optical concentrator
2 focussed energy receiver/converter for line-focus concentrator
3 flexible side for line-focus concentrator
4 back surface for line-focus concentrator
5 means for adding or removing inflation gas for line-focus concentrator
6 flexible end cap for line-focus concentrator
7 means for extracting useful energy from line-focus concentrator
8 flexible point-focus Fresnel lens optical concentrator
9 focussed energy receiver/converter for point-focus concentrator
10 flexible side for point-focus concentrator
11 back surface for point-focus concentrator
12 means for extracting useful energy from point-focus concentrator
13 means for adding or removing inflation gas for point-focus concentrator.

SUMMARY

In accordance with the present invention, a solar energy concentrator comprises at least one refractive optical element, said optical element producing a focal region of concentrated sunlight; at least one flexible side surface; and at least one back surface, said back surface providing support for an energy receiving means located in the focal region of said refractive optical element; and a means for admitting inflation gas into the volume of space surrounded by said optical element and said side surface and said back surface.

PREFERRED EMBODIMENTS—DESCRIPTION

FIG. 1 shows the preferred line-focus embodiment of my invention, with an end cap removed to show the inner components of the invention. A flexible, arch-shaped line-focus Fresnel lens 1 forms the front or sun-facing surface of the inflatable solar concentrator. This lens 1 is made from a transparent polymeric material, such as a clear silicone rubber or fluoropolymer, by molding or similar processes well known to those skilled in the art. The outer convex surface of the lens can be coated with well known thin films to provide protection against ultraviolet radiation, monatomic oxygen, and electrostatic discharge effects in space. The lens 1 includes a plurality of small linear prisms of varying angles selected to provide a line focus of incident sunlight, configured using Fresnel lens design principles well known to those skilled in the art. An energy receiver/converter 2 is located in the line focus produced by lens 1.

This receiver/converter 2 includes electrically interconnected photovoltaic cells, such as gallium arsenide or silicon cells, which are sized to match the line focus produced by lens 1. The receiver/converter 2 is mounted to and supported by the back surface 4, which may also serve as the radiator surface to dissipate waste heat from the receiver/converter 2. The back surface 4 is made from a strong and thermally conductive material, such as aluminum or graphite/epoxy composite. The volume of space between lens 1 and back surface 4 is partially enclosed by flexible sides 3 which are contiguous with both the lens 1 and the back surface 4. The flexible sides 3 are made from a lightweight film material, such as aluminized polyester film. A means 5 for adding or removing inflation gas from the enclosed volume of space is provided in the form of a valve or similar structure.

Figure 2:
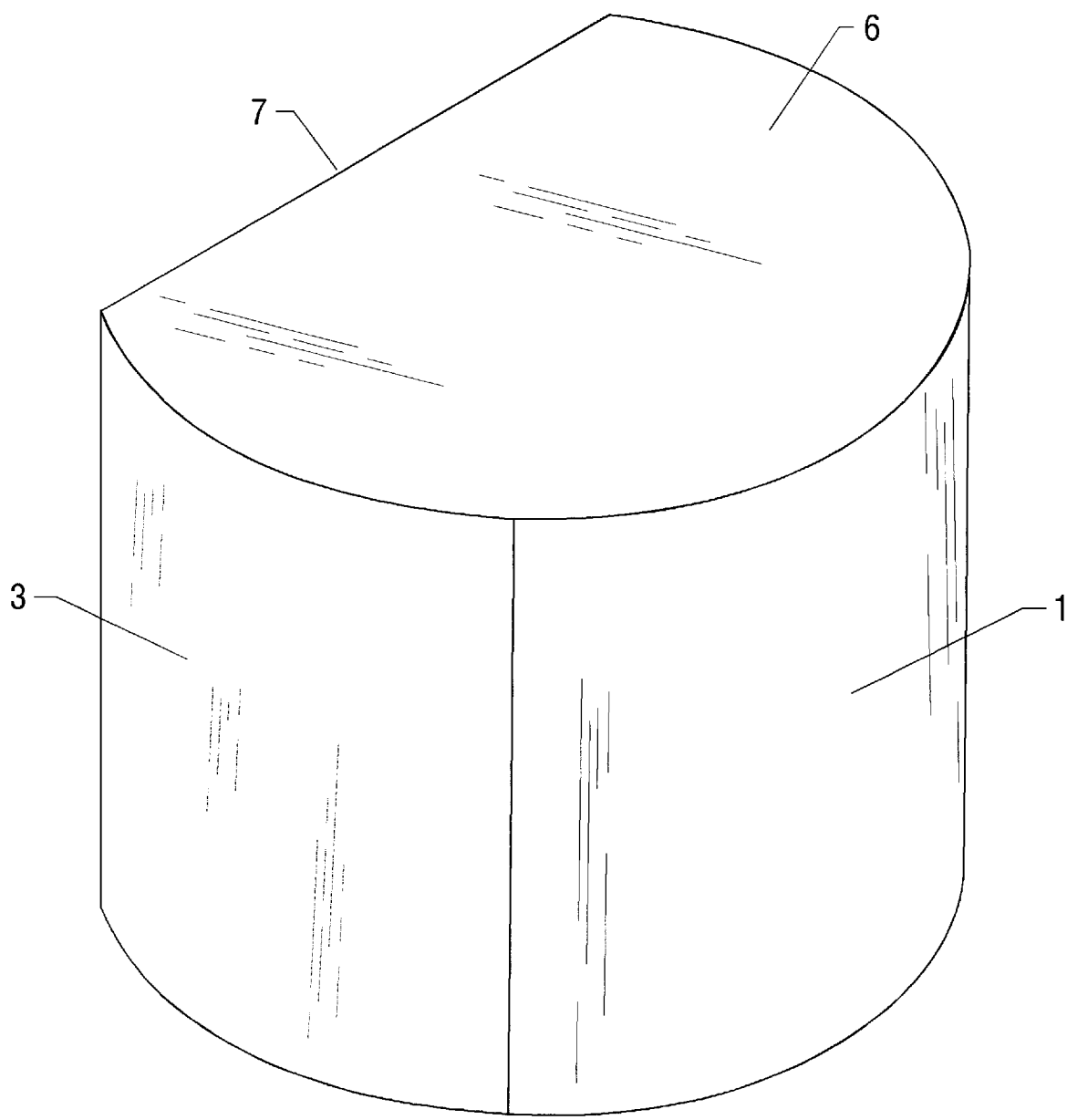
FIG. 2 is a perspective view of a line-focus embodiment of my invention with an end cap in place.

FIG. 2 shows the preferred line-focus embodiment of my invention, with the end cap 6 in place. The end cap 6 of FIG.

2 is contiguous to the lens 1, the sides 3, and the back surface 4 shown in FIG. 1. A similar end cap is used at the opposite end of the structure to complete the enclosure of the volume of space between the lens 1 and back surface 4 shown in FIG. 1. The end cap 6 is preferably made of the same lightweight film material as the sides 3. FIG. 2 also shows a means 7 for extracting the useful electrical energy from the electrically interconnected solar cells forming the energy receiver/converter 2 previously shown in FIG. 1. These means 7 for extracting useful electrical energy can be properly sized electrically conductive wires or ribbons.

The contiguous surfaces enclosing the volume of space between the lens and the back surface, including the lens 1, the sides 3, the back surface 4, and the end caps 6, are joined together at their contiguous seams to provide a container for an inflation gas such as hydrogen, helium, or nitrogen. The seams can be made substantially leak-proof with an adhesive, such as space-qualified silicone rubber, or with a mechanical joint, between contiguous surfaces. The inflation gas will be at extremely low pressure (less than 1 Pascal or 0.0001 pounds per square inch) on orbit, such that very little gas leakage will occur even for imperfect seams between contiguous parts.

Figure 3:
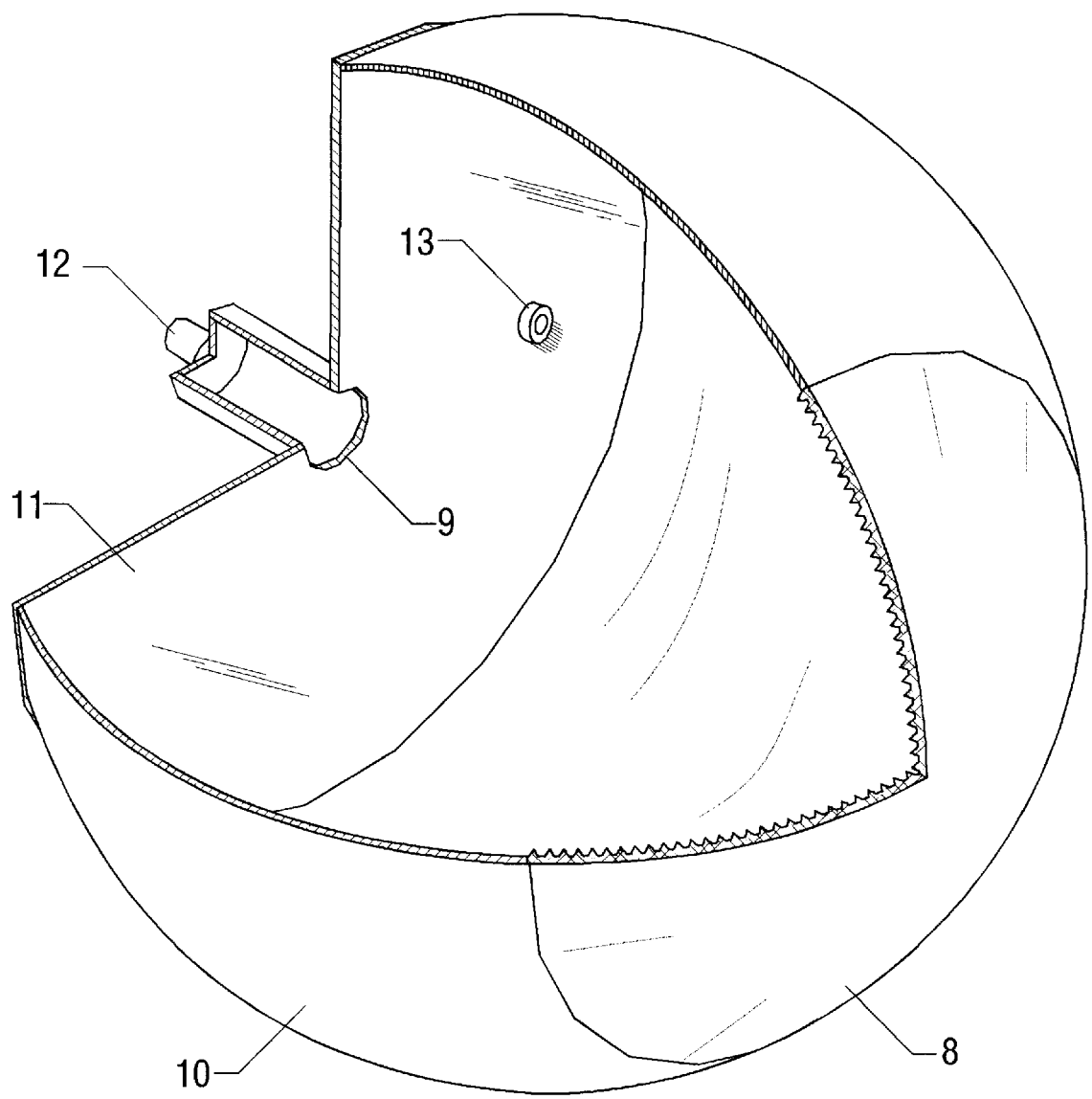
FIG. 3 is a perspective view of a point-focus embodiment of my invention, with one quadrant removed to show the inner components.

FIG. 3 shows the preferred point-focus embodiment of my invention, with a quadrant removed to show the inner components of the invention. A flexible, dome-shaped point-focus Fresnel lens 8 forms the front or sun-facing surface of the inflatable solar concentrator. This lens 8 is made from a transparent polymeric material, such as a clear silicone rubber or fluoropolymer, by molding or similar processes well known to those skilled in the art. The outer convex surface of the lens can be coated with well known thin films to provide protection against ultraviolet radiation, monatomic oxygen, and electrostatic discharge effects in space. The lens 8 includes a plurality of small annular prisms of varying angles selected to provide a point focus of incident sunlight, configured using Fresnel lens design principles well known to those skilled in the art. An energy receiver/converter 9 is located in the point focus produced by lens 8.

This receiver/converter 9 includes a high temperature heat receiver, sized to match the point focus produced by lens 8, and an energy converter. The energy converter will include means for converting a portion of the high-temperature heat into a more useful form of energy, such as electrical energy or kinetic energy of a propulsion gas. The energy converter can be a thermodynamic engine, operating on the Brayton, Stirling, or Rankine cycle, or a solar thermal propulsion system. The receiver/converter 9 is mounted to and supported by the back surface 11, which may also serve as the radiator surface to dissipate waste heat from the receiver/converter 9. The receiver/converter 9 will include a means 12 for extracting the useful energy from the receiver/converter 9. This extraction means 12 can be a set of fluid conduits, if heat is the extracted form of energy, or a set of optical fibers, if concentrated light is the extracted form of energy, or a set of electrical conductors, if electricity is the extracted form of energy.

The back surface 11 is preferably made from a strong and thermally conductive material, such as aluminum or graphite/epoxy composite. The volume of space between lens 8 and back surface 11 is partially enclosed by flexible sides 10 which are contiguous with both the lens 8 and the back surface 11. The flexible sides 10 are made from a lightweight film material, such as aluminized polyester film. A means 13 for adding or removing inflation gas from the enclosed volume of space is provided in the form of a valve or similar structure.

The contiguous surfaces enclosing the volume of space between the lens and the back surface, including the lens 8, the sides 10, and the back surface 11, are joined together at their contiguous seams to provide a container for an inflation gas such as hydrogen, helium, or nitrogen. The seams can be made substantially leak-proof with an adhesive, such as space-qualified silicone rubber, or with a mechanical joint, between contiguous surfaces. The inflation gas will be at extremely low pressure (less than 1 Pascal or 0.0001 pounds per square inch) on orbit, such that very little gas leakage will occur even for imperfect seams between contiguous parts.

Comparison of FIGS. 1 and 2 with FIG. 3 shows a strong similarity between the two preferred embodiments of my invention. Both the line-focus embodiment of FIGS. 1 and 2, and the point-focus embodiment of FIG. 3 use lenses, sides, back surfaces, energy receiver/converters, means for inflation gas addition, and means for extraction of useful energy. The primary difference between the two embodiments relates to the linear, cylindrical geometry of the principal components of FIGS. 1 and 2, and the annular, spherical geometry of the principal components of FIG. 3. To those skilled in the art of optical systems, the line-focus system of FIGS. 1 and 2 is clearly a two-dimensional solar concentrator, while the point-focus system of FIG. 3 is clearly a three-dimensional solar concentrator.

For optimal performance, the energy receiver/converter 2 of FIG. 1 should be located at a greater distance from the lens than the centerline axis of the cylinder containing the lens 1 and the sides 3. By proper selection of this distance, and by appropriate configuration of the prisms in the lens 1, the lens can be made to conform closely to the optimized symmetrical refraction line-focus lens geometry taught by O'Neill in U.S. Pat. No. 4,069,812.

For optimal performance, the energy receiver/converter 9 of FIG. 3 should be located at a greater distance from the lens than the center of the sphere containing the lens 8 and the sides 10. By proper selection of this distance, and by appropriate configuration of the prisms in the lens 8, the lens can be made to conform closely to the optimized symmetrical refraction point-focus lens geometry taught by O'Neill in U.S. Pat. No. 4,069,812.

The line-focus concentrator geometry, shown in FIGS. 1 and 2, corresponds to a deployed, pressurized solar concentrator on orbit in space. Prior to launch, the concentrator would be deflated, with the lens 1, sides 3, and end caps 6 all folded against the back surface 4 to form a flat, low-volume package.

The point-focus concentrator geometry, shown in FIG. 3, corresponds to a deployed, pressurized solar concentrator on orbit in space. Prior to launch, the concentrator would be deflated, with the lens 8 and sides 10 folded against the back surface 11 to form a flat, low-volume package.

PREFERRED EMBODIMENTS—OPERATION

The line-focus inflatable solar concentrator of FIGS. 1 and 2 functions in the following manner. The Fresnel lens 1 is always maintained in a sun-facing orientation to capture the maximum amount of incident solar flux. The solar rays are first refracted by the smooth, convex outer surface of the lens 1 as the rays enter the lens material, and are further refracted by the faceted, concave inner surface of the lens 1 as the rays exit the lens material. The combined refraction effect of the inner and outer surfaces of the lens 1 causes the solar rays to converge into a narrow, elongated, rectangular focal region, where an energy receiver/converter 2 is placed to intercept, capture, and convert the focussed sunlight into a useful energy output. The energy receiver/converter 2 can utilize photovoltaic cells to perform a direct conversion of sunlight to direct-current electricity.

Such photovoltaic cells can be made from a variety of semiconductor materials, including silicon, gallium arsenide, gallium indium phosphide, germanium, gallium antimonide, or other material or combination of materials. Since the best photovoltaic cells only convert about 30% of the incident sunlight to electricity, the remaining 70% must be dissipated as waste heat. In space, the only effective method of dissipating waste heat is by radiation to space. This radiative cooling requires significant radiator area to maintain the cell temperature in the optimal range. By mounting the energy receiver/converter directly against the back surface 4 of the concentrator, and by making the back surface 4 of a heat-conducting material such as aluminum or graphite epoxy composite, the back surface 4 can serve as a very efficient radiator.

Furthermore, by making the back surface 4 from a rigid material such as aluminum or graphite epoxy composite sheet, the back surface 4 can be the main structural element in the concentrator. The multi-use back surface 4 can also serve as a convenient stowing surface, against which the deflated lens 1, sides 3, and end caps 6 can be folded for low-volume stowage during launch into space. The back surface 4 can also be the mounting surface for the valve 5 which is used in space to admit low-pressure gas to inflate the concentrator. Finally, energy extraction means 7 are provided to allow the useful energy to be removed from the receiver/converter for use on board the satellite or space probe. This energy extraction means 7 can be a set of wires or electrically conductive ribbons which carry the direct current electricity to the power management and distribution system of the satellite.

The point-focus inflatable solar concentrator of FIG. 3 functions in the following manner. The Fresnel lens 8 is always maintained in a sun-facing orientation to capture the maximum amount of incident solar flux. The solar rays are first refracted by the smooth, convex outer surface of the lens 8 as the rays enter the lens material, and are further refracted by the faceted, concave inner surface of the lens 8 as the rays exit the lens material. The combined refraction effect of the inner and outer surfaces of the lens 8 causes the solar rays to converge into a small, circular, spot-shaped focal region, where an energy receiver/converter 9 is placed to intercept, capture, and convert the focussed sunlight into a useful energy output.

The energy receiver/converter 9 can utilize a heat receiver to convert the concentrated solar flux into high-temperature thermal energy. This high-temperature thermal energy can then be further converted into a more useful form of energy. For example, the thermal energy can be used to heat up hydrogen in a closed container until very high pressures are obtained; thereafter, the hydrogen can be expanded through a rocket nozzle and expelled into space to provide propulsion for the satellite or probe. Alternatively, the high-temperature thermal energy can be converted to electricity using a heat engine of the Brayton, Stirling, or Rankine cycle varieties.

Since the best heat engines only convert about 40% of the incident sunlight to electricity, the remaining 60% must be dissipated as waste heat. In space, the only effective method of dissipating waste heat is by radiation to space. This radiative cooling requires significant radiator area to maintain the radiator temperature in an optimal range. By mounting the energy receiver/converter in close proximity to the back surface 11 of the concentrator, and by making the back surface 11 of a heat-conducting material such as aluminum or graphite epoxy composite, the back surface 11 can serve as a convenient and efficient radiator. Furthermore, by making the back surface 11 from a rigid material such as aluminum or graphite epoxy composite sheet, the back surface 11 can be the main structural element in the concentrator, providing the mounting platform for the energy receiver/converter 9. The multi-use back surface 11 can also serve as a convenient stowing surface, against which the deflated lens 8 and sides 10 can be folded for low-volume stowage during launch into space. The back surface 11 can also be the mounting surface for the valve 13 which is used in space to admit low-pressure gas to inflate the concentrator. Finally, energy extraction means 12 are provided to allow the useful energy to be removed from the receiver/converter for use on board the satellite or space probe. This energy extraction means 12 can be a set of electrical conductors if the useful energy is electricity; or a set of fluid conduits if the useful energy is heat; or a set of optical fibers if the useful energy is light; or a steerable rocket nozzle if the useful energy is kinetic energy in a propellant.

The inflatable line-focus concentrator, of FIGS. 1 and 2, is shown in its deployed configuration on orbit in space. Prior to deployment, the deflated concentrator will be substantially flat, with the flexible parts, including lens 1, sides 3, and end caps 6, folded against the back surface 4. Once on orbit, the concentrator will be deployed by the controlled addition of a low-pressure gas, such as hydrogen, helium, or nitrogen, through the valve 5 into the volume of space contained by the lens 1 sides 3, back surface 4, and end caps 6.

The inflatable point-focus concentrator of FIG. 3 is shown in its deployed configuration on orbit in space. Prior to deployment, the deflated cocnentrator will be substantially flat, with the flexible parts, including lens 8 and sides 10, folded against the back surface 11. Once on orbit, the concentrator will be deployed by the controlled addition of a low-pressure gas, such as hydrogen, helium, or nitrogen, through the valve 13 into the volume of space contained by the lens 8, sides 10, and back surface 11.

CONCLUSIONS, RAMIFICATIONS, AND SCOPE

Accordingly, it can be seen that my invention provides higher optical performance, lower weight, smaller stowage volume, larger tolerances for manufacturing and operational inaccuracies, and improved robustness, compared to prior art solar concentrators for space power.

Although the description above contains many specificities, these should not be construed as limiting the scope of the invention but as merely providing illustrations of some of the presently preferred embodiments of this invention. Various other embodiments and ramifications are possible within its scope. For example, the line-focus embodiment of FIGS. 1 and 2 could be configured as a heat collector rather than as a photovoltaic concentrator, if thermal energy were desired as the useful energy output instead of electricity. Similarly, the point-focus focus embodiment of FIG. 3 could be configured as a photovoltaic concentrator rather than as a heat collector, if electricity were desired as the useful energy output instead of high-temperature heat.

Furthermore, while the preferred embodiments described above showed only one lens per system, it should be apparent to those skilled in the art that a contiguous plurality of such inflatable concentrators can be integrated together, with significant savings in materials, if common components, such as sides or back surfaces, are shared by the plurality of concentrators. Therefore, multi-element arrays of either line-focus or point-focus lenses, sharing a common inflatable volume, also represent an integral part of my new invention.

Furthermore, while the preferred embodiments described above showed purely inflatable solar concentrators, these examples are not meant to exclude mechanical support means in collaboration with inflation support means in the present invention. Thus, solar concentrators which utilize my new configuration for inflationary deployment on orbit, but which are also strengthened or supported by mechanical means, including struts, rods, springs, or other rigid or semi-rigid structures, also fall within the scope of my invention. Similarly, solar concentrators which utilize my new configuration for initial deployment only, and are later made mechanically rigid by other physical or chemical means, such as foam addition and curing within contained tubes, or such as ultraviolet radiation induced hardening of polymer materials, also fall within the scope of my invention.

Thus the scope of the invention should be determined by the appended claims and their legal equivalents, rather than by the specific examples given.

What is claimed is:

1. A solar energy concentrator comprising at least one refractive optical element, said optical element producing a focal region of concentrated sunlight; at least one flexible side surface; at least one back surface, said back surface providing support for an energy receiving means located in the focal region of said reflective optical element where said back surface includes means for radiative cooling; and a means for admitting inflation gas into the volume of space surrounded by said optical element and said side surface and said back surface.

2. The solar energy concentrator of claim 1, wherein said refractive optical element is a Fresnel lens configured to focus sunlight onto said energy receiving means.

3. The solar energy concentrator of claim 1, wherein said energy receiving means includes at least one photovoltaic cell.

4. The solar energy concentrator of claim 1, wherein said energy receiving means includes at least one solar heat receiver.

5. The solar energy concentrator of claim 1, wherein said refractive optical element is configured to provide a line focus of sunlight.

6. The solar energy concentrator of claim 1, wherein said refractive optical element is configured to provide a point focus of sunlight.

7. The solar energy conncentrator of claim 1 wherein the energy receiving means is integral with the back surface.

8. A solar energy concentrator for use in space comprising the following elements:
    at least one Fresnel lens configured to focus sunlight into a focal region;
    at least one side surface contiguous to said Fresnel lens, and partially enclosing a volume of space between said lens and said focal region;
    at least one back surface, contiguous to said side surface, and substantially completing the enclosure of said volume of space between said lens and said focal region where said back surface is configured to dissipate heat by radiation;
    at least one energy receiving means located in said focal region, said energy receiving means supported by said back surface; and
    a gas contained within said volume of space between said lens and said focal region, said gas exerting an outwardly supportive force on said lens and on said side surface and on said back surface surrounding said volume, where the outward supportive pressure exerted by said gas is greater than the pressure of the atmosphere outside of the concentrator.

9. The solar energy concentrator of claim 8, wherein the energy receiving means includes at least one photovoltaic cell.

10. The solar energy concentrator of claim 8, wherein the energy receiving means includes at least one solar heat receiver.

11. The solar energy concentrator of claim 8, wherein said lens is configured to provide a line of focus of sunlight.

12. The solar energy concentrator of claim 8, wherein said lens is configured to provide a point focus of sunlight.

13. The solar energy concentrator of claim 8 wherein the energer receiving means is disposed in contacting relation with the back surface.

14. A space power system comprising:
    at least one Fresnel lens focusing sunlight into a focal region;
    at least one side surface contiguous to said lens and partially enclosing a volume of space between said lens and said focal region;
    at least one back surface contiguous to said side surface and substantially completing the enclosure of said volume, such that a gas pressure can be sustained within said volume by said lens, said side surface, and said back surface; and
    at least one energy receiving means located in said focal region and supported by said back surface, where said back surface includes a housing configured to dissipate heat by radiation.

15. The space power system of claim 14, wherein said energy receiving means includes at least one photovoltaic cell.

16. The space power system of claim 14, wherein said energy receiving means includes at least one solar heat receiver.

17. The space power system of claim 14, wherein said lens is configured to provide a line focus of sunlight.

18. The space power system of claim 14, wherein said lens is configured to provide a point focus of sunlight.

19. The space power system of claim 14, wherein a contiguous plurality of the lenses share a common said side surface and a common said back surface, with a common enclosed volume of space surrounded by lenses, said side surface and said back surface.

20. The space power system of claim 14 wherein the energy receiving means is disposed in abutting relation with the back surface.

* * * * *